United States Patent
Heimann et al.

(10) Patent No.: US 9,966,950 B2
(45) Date of Patent: May 8, 2018

(54) CONTACT AND/OR PROXIMITY-SENSITIVE INPUT DEVICE

(71) Applicant: DIEHL AKO STIFTUNG & CO. KG, Wangen (DE)

(72) Inventors: Uwe Heimann, Wangen (DE); Michael Prinz, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 0 days. days.

(21) Appl. No.: 15/188,003

(22) Filed: Jun. 21, 2016

(65) Prior Publication Data

US 2016/0301411 A1    Oct. 13, 2016

Related U.S. Application Data

(63) Continuation of application No. PCT/EP2014/003184, filed on Nov. 27, 2014.

(30) Foreign Application Priority Data

Dec. 21, 2013    (DE) .................. 10 2013 021 879

(51) Int. Cl.
*H03K 17/975*    (2006.01)
*H03K 17/955*    (2006.01)
(Continued)

(52) U.S. Cl.
CPC .......... *H03K 17/955* (2013.01); *H03K 17/962* (2013.01); *H03K 17/9622* (2013.01);
(Continued)

(58) Field of Classification Search
CPC .......... H03K 2217/96023; H03K 2217/96046; H03K 2217/960755; H03K 2217/960785;
(Continued)

(56) References Cited

U.S. PATENT DOCUMENTS 4,078,257 A  *  3/1978  Bagley .................. G06F 3/0238
                                                        200/5 R
7,507,929 B2    3/2009  Streifler
(Continued)

FOREIGN PATENT DOCUMENTS

DE      102010030315 A1    12/2011
EP          1970479 A2      9/2008
(Continued)

*Primary Examiner* — Anthony R. Jimenez
(74) *Attorney, Agent, or Firm* — Laurence A. Greenberg; Werner H. Stemer; Ralph E. Locher (57) ABSTRACT

A contact and/or proximity-sensitive input device has a cover plate with a light-transmissive control section facing a user of the input device and forming a control field for the user. A light-transmissive sensor film has at least one capacitive sensor field. A carrier plate carries at least one lighting device. The input device also has a light-transmissive decorative film with at least one decorative element. The film is a separate component from the sensor film so that the decorative film can be produced independently of the sensor film and can be adapted simply to desired variants of the input device. The carrier plate, decorative film, sensor film and cover plate are arranged successively in such a way that the light emitted by the lighting device passes through the decorative film, sensor film and control section of the cover plate.

13 Claims, 5 Drawing Sheets

(51) Int. Cl.
H03K 17/96 (2006.01)
*H03K 17/945* (2006.01)

(52) U.S. Cl.
CPC ............ *H03K 2017/9455* (2013.01); *H03K 2217/96023* (2013.01); *H03K 2217/96046* (2013.01); *H03K 2217/96079* (2013.01); *H03K 2217/960755* (2013.01); *H03K 2217/960785* (2013.01)

(58) Field of Classification Search
CPC ....... H03K 2217/96079; H03K 17/962; H03K 17/9622; H03K 17/955; H03K 2017/9455; H01H 9/00; H01H 9/02; H01H 9/04; H01H 9/16; H01H 9/18; H01H 9/181; H01H 9/182; H01H 13/00; H01H 13/02; H01H 13/50; H01H 13/68; H01H 13/70; H01H 13/7006; H01H 13/702; H01H 2003/12; H01H 2009/16; H01H 2009/164; H01H 2009/18; H01H 2009/182; H01H 2009/184; H01H 2009/186; H01H 2009/187; H01H 2219/014; H01H 2219/018; H01H 2219/036; H01H 2219/039

USPC .......................................................... 200/600
See application file for complete search history.

(56) References Cited

U.S. PATENT DOCUMENTS

| | | | |
|---|---|---|---|
| 8,610,017 | B2 | 12/2013 | Kobayashi et al. |
| 2007/0068789 | A1 | 3/2007 | Streifler |
| 2008/0225016 | A1 | 9/2008 | Lee |
| 2010/0118560 | A1 | 5/2010 | Hayama et al. |
| 2013/0194759 | A1 | 8/2013 | Kang et al. |
| 2014/0054156 | A1* | 2/2014 | Chang ............... H03K 17/9622 200/600 |

FOREIGN PATENT DOCUMENTS

| | | |
|---|---|---|
| EP | 1629330 B1 | 3/2010 |
| EP | 2395531 A1 | 12/2011 |
| WO | 2009153161 A1 | 12/2009 |
| WO | 2015090510 A1 | 6/2015 |

* cited by examiner

CONTACT AND/OR PROXIMITY-SENSITIVE INPUT DEVICE

CROSS-REFERENCE TO RELATED APPLICATION

This application is a continuation, under 35 U.S.C. § 120, of copending international application No. PCT/EP2014/003184, filed Nov. 27, 2014, which designated the United States; this application also claims the priority, under 35 U.S.C. § 119, of German patent application No. DE 10 2013 021 879.9, filed Dec. 21, 2013; the prior applications are herewith incorporated by reference in their entirety.

BACKGROUND OF THE INVENTION

Field of the Invention

The present invention relates to a contact sensitive and/or proximity-sensitive input device, in particular having a capacitive functional principle and in particular for a household electronic appliance.

In many electrical or electronic appliances, and particularly in household appliances such as ovens, stoves, microwave ovens, dishwashers, washing machines, tumble dryers and the like, contact and/or proximity-sensitive pushbuttons or contact switches or proximity switches are often used which, for example, start a particular switching process and/or change an appliance setting by simple contact or proximity of a user.

In the case of a capacitive switch, a capacitive sensor element made of an electrically conductive material forms, together with, say, a finger of the user, by means of a dielectric (often in the form of a cover plate made of an electrically insulating material), a capacitor which is variable according to the actuation of the switch, i.e. the contact or noncontact, or proximity or nonproximity, of a control field assigned to the capacitive sensor element. The variation in the capacitance of the capacitive sensor element correspondingly affects an output signal of the sensor circuit, which signal can be processed and evaluated by evaluation electronics, in order if appropriate to interpret actuation of the capacitive switch.

Such capacitive contact and/or proximity-sensitive input devices have, for example, a light-transmissive film comprising one or more capacitive sensor fields, the sensor fields being formed by electrically conductive printing or coating of the film. As described, for example, in U.S. Pat. No. 7,507,929 B2 and its counterpart European patent EP 1 629 330 B1, the film may furthermore be printed or coated with symbols in order, by means of transmitted illumination, to represent a corresponding symbol for the user in order, for example, to identify the control field and its functionality. Decorative elements and a sensor film are thus combined in one component, which is intended to simplify the assembly of the input device.

SUMMARY OF THE INVENTION

It is accordingly an object of the invention to provide an input device which overcomes the above-mentioned and other disadvantages of the heretofore-known devices and methods of this general type and which provides for an improved contact and/or proximity-sensitive input device which can be easily adapted to different variants, in particular design variants.

With the foregoing and other objects in view there is provided, in accordance with the invention, a contact and/or proximity-sensitive input device, comprising:

a cover plate having at least one at least partially light-transmissive control section, the control section facing toward a user of the input device and forming a control field for the user;

an at least partially light-transmissive sensor film having at least one capacitive sensor field;

an at least partially light-transmissive decorative film having at least one decorative element, said decorative film being configured as a separate component from said sensor film; and a carrier plate and at least one lighting device disposed on said carrier plate;

said carrier plate, said decorative film, said sensor film and said cover plate being successively disposed relative to one another so that light emitted by said lighting device passes through said decorative film, said sensor film and said control section of said cover plate.

In other words, the contact and/or proximity-sensitive input device, which is particularly suited for a (large) household appliance, comprises a cover plate having at least one at least partially light-transmissive control section, the control section facing toward a user of the input device and forming a control field for the user; an at least partially light-transmissive sensor film having at least one capacitive sensor field; an at least partially light-transmissive decorative film having at least one decorative element, which film is configured as a separate component from the sensor film; and a carrier plate on which at least one lighting device or light source is arranged, wherein the carrier plate, the decorative film, the sensor film and the cover plate are arranged successively so that the light emitted by the lighting device passes through the decorative film, the sensor film and the control section of the cover plate.

Owing to the separate production of the sensor film and the decorative film as separate components, the decorative film and therefore the entire input device can be adapted in a simple way to a wide variety of intended designs of the input device. In this case, the two films may preferably be provided individually and processed further separately from one another. Compared with the decorative film, the sensor film generally has only a small variance in relation to a product, or product range. The sensor film can therefore preferably be provided and produced in a larger batch number and therefore more economically. Owing to the separate manufacture of the sensor film and the decorative film, the two films furthermore respectively have a lower complexity and are easier to manufacture. The sensor film and the decorative film may also preferably be mounted separately from one another on a common carrier or on different carriers in the input device.

The carrier plate is in this context preferably a printed circuit board or a plastic plate. The carrier plate is preferably configured as a stable plate body, although it may also be present only in film thickness.

The side of a component facing toward or away from the user is in this case intended to mean that side which, in the installed state of the input device (for example in a household electronic appliance), faces toward the user (i.e. faces outward) or away from the user (i.e. faces inward).

Depending on the number of sensor films and sensor fields, the input device may in this context comprise one or more capacitive contact and/or proximity-sensitive switches.

In the input device according to the invention, the carrier plate, the decorative film, the sensor film and the cover plate are arranged in series, i.e., successively, so that the light emitted by the lighting device passes through the decorative film, the sensor film and the control section of the cover plate. In this case, the decorative elements of the decorative film need not necessarily be arranged behind the sensor fields of the sensor film, but may optionally also be positioned offset therefrom. Likewise, the lighting device on the carrier plate need not necessarily be arranged behind the sensor fields of the sensor film, but may optionally also be positioned offset therefrom. Depending on the application, the sensor fields may thus be back-lit and/or marked with decorative elements and/or regions next to the sensor fields may be back-lit and/or marked with decorative elements. In this context, the term decorative element is intended to comprise both positive decorative elements, in which case the decorative element can be illuminated by transmission and the surroundings remain dark, and negative decorative elements, in which case the decorative element remains dark and the surroundings can be illuminated by transmission, as well as combinations of the two types. Furthermore, the decorative element may be configured in such a way that it remains identifiable or becomes unrecognizable for the observer when the lighting device is not being operated. In this context, the decorative element refers in particular to symbols, numbers, letters, segments, a pictogram, bars and single or multiple combinations of these elements. In addition or as an alternative, the decorative element may be a transparent colored element.

The at least one lighting device is preferably a light-emitting diode or a light-emitting diode group. The lighting device may preferably be driven variably in its operating mode (on/off, continuous light, flashing light, etc.), its luminosity and/or its light color. In the case of a plurality of lighting device, they may preferably be driven independently of one another.

The sensor film and/or the decorative film are preferably based on a transparent plastic film. The plastic film is preferably made of PET, PC or the like. The sensor film and/or the decorative film may be constructed in one or more layers. The sensor fields are preferably printed or coated onto the sensor film (for example with an electrically conductive paint, paste or ink). The printing or the coating is preferably carried out in one or more layers. The sensor film and/or the decorative film preferably have a layer thickness of at most 0.5 mm, more preferably at most 0.3 mm or less. The sensor film is preferably configured as a nonrigid component.

The cover plate, or at least its control section, are preferably made of an electrically insulating material, so that it acts as a dielectric between the sensor fields and the user. As an alternative, an electrically insulating element is additionally provided on the side of the cover plate facing toward the user. The cover plate is preferably made of a plastic material (for example PC, PMMA), glass, a glass ceramic or the like. The cover plate and its control section are preferably configured substantially in a planar fashion, although they may also be configured in a curved or bent fashion.

In one preferred configuration of the invention, the sensor film has at least one electrical contact field which is electrically conductively connected to the capacitive sensor field, and at least one electrical contact element, which is in electrically conductive contact with the electrical contact field of the sensor film, is arranged on the carrier plate. The electrical contact fields are preferably printed or coated onto the sensor film and connected to the sensor fields by means of printed or coated conductive tracks.

In one preferred configuration of the invention, evaluation electronics which are electrically conductively connected to the at least one electrical contact element are also arranged on the carrier plate. In connection with the present invention, the evaluation electronics are used in particular to process and evaluate the output signals detected at the at least one capacitive sensor field of the sensor film, in order to establish actuation of the switch (by contact or proximity of the control field of the control section of the cover plate). To be distinguished from these evaluation electronics is the controller, for example of the household appliance in which the input device of the invention may be installed, to which the evaluation electronics are connected and which may be arranged together with the evaluation electronics on the carrier plate or at a different position in the household appliance. In some applications, the evaluation electronics may also preferably be integrated into this controller.

In one preferred configuration of the invention, at least one spacer element is provided on the side of the carrier plate facing toward the cover plate in order to separate the decorative film, the sensor film and/or the cover plate from the at least one lighting device on the carrier plate. The spacer element is preferably connected firmly to the carrier plate.

In another preferred configuration of the invention, the sensor film is firmly (permanently or releasably) connected, preferably adhesively bonded, to this spacer element. The spacer element in this case forms a carrier for the sensor film. When the input device is being assembled, the sensor film may preferably be premounted on the spacer element. In this configuration, the decorative film is preferably arranged on the side of the sensor film and its carrier facing toward the user.

In this configuration, the spacer element preferably has a contacting section which is configured in order to keep the at least one electrical contact field of the sensor film in electrically conductive contact with the at least one electrical contact element on the carrier plate. The contacting section is preferably connected firmly or rigidly to the spacer element, or formed integrally therewith. The contacting section may preferably be configured resiliently and be prestressed in the direction of the carrier plate. As an alternative, the at least one electrical contact element on the carrier plate may be configured and/or fitted resiliently and be prestressed in the direction of the cover plate.

In another preferred configuration of the invention, the sensor film is firmly connected (permanently or releasably), preferably adhesively bonded, to the side of the cover plate facing away from the user. The cover plate in this case forms a carrier for the sensor film. When the input device is being assembled, the sensor film may preferably be premounted on the cover plate. In this configuration, the decorative film is preferably arranged on the side of the sensor film and its carrier facing away from the user. Optionally, however, the decorative film may also be arranged on the side of the cover plate facing toward the user.

In this configuration, the cover plate has a contacting section which is configured in order to keep the at least one electrical contact field of the sensor film in electrically conductive contact with the at least one electrical contact element on the carrier plate. The contacting section is preferably connected firmly or rigidly to the cover plate, or formed integrally therewith. The contacting section may preferably be configured resiliently and be prestressed in the direction of the carrier plate. As an alternative, the at least one electrical contact element on the carrier plate may be configured and/or fitted resiliently and be prestressed in the direction of the cover plate.

In another preferred configuration of the invention, the decorative film is firmly (permanently or releasably) connected to the sensor film. Preferably, the decorative film is adhesively bonded to the sensor film or laminated thereon.

As an alternative or in addition, the decorative film may preferably be firmly (permanently or releasably) connected to the cover plate or to the spacer element.

In yet another preferred configuration of the invention, the at least one spacer element is configured as a light guide element for guiding the light emitted by the at least one lighting device in the direction of the cover plate. The light guide element may preferably comprise at least one hollow channel with reflective side walls, or at least one light guide body.

In yet another preferred configuration of the invention, the sensor film (at least in the installed state) is bent in such a way that the at least one capacitive sensor field and the at least one electrical contact field are positioned in two different planes essentially parallel to the carrier plate. In this way, the distance between the sensor film and the carrier plate due to the spacer element can be bridged without using additional components.

The invention also relates to a household electronic appliance having at least one abovedescribed contact and/or proximity-sensitive input device of the invention. The (large) household appliance is preferably an appliance for treating laundry (for example a washing machine, tumble dryer, etc.), a dishwasher, a hob, an oven, a refrigerator and/or freezer or the like.

In a preferred configuration of the invention, the control section of the cover plate of the input device according to the invention is arranged behind an at least partially light-transmissive control panel or in a recess of a control panel.

Other features which are considered as characteristic for the invention are set forth in the appended claims.

Although the invention is illustrated and described herein as embodied in a contact and/or proximity-sensitive input device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Referring now to the figures of the drawing in detail and first, particularly, to FIGS. 1-3 thereof, a first exemplary embodiment of a contact and/or proximity-sensitive input device, such as may for example be used in a (large) household appliance, for example a washing machine or a dishwasher, will now be described in more detail.

The input device is installed behind a control panel 10, for example made of plastic, in the household appliance. In this case, a rectangular recess 12 or cutout 12 is provided in the control panel 10. Instead of the recess 12, the control panel 10 may also have a transparent region. The (outer) side facing toward the user is respectively on the top in FIGS. 1 to 3.

A cover plate 14, for example made of a transparent, or at least translucent, electrically insulating plastic, glass or glass ceramic material, is arranged on the side of the control panel 10 facing away from the user. This cover plate 14 has an essentially planar plate section 14a. On the side of this plate section 14a facing toward the user, the cover plate 14 has an essentially planar control section 14b. This control section 14b is shaped and dimensioned in accordance with the recess 12 in the control panel 10, so that it protrudes into the recess 12 and ends essentially flush with the outer side of the control panel 10 (cf. FIG. 1). The cover plate 14 is, for example, adhesively bonded to the control panel 10, and any gap between the control section 14b and the edge of the recess 12 is preferably encapsulated or adhesively bonded.

Figure 1:
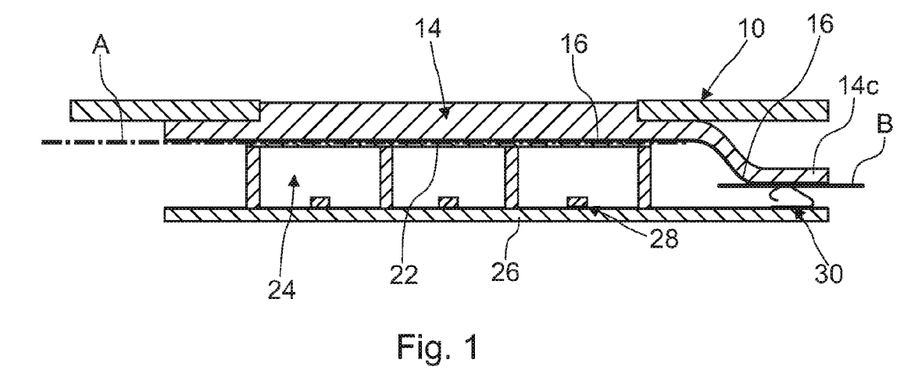
FIG. 1 shows a cross-sectional view of an input device according to a first exemplary embodiment of the invention.
Figure 2:
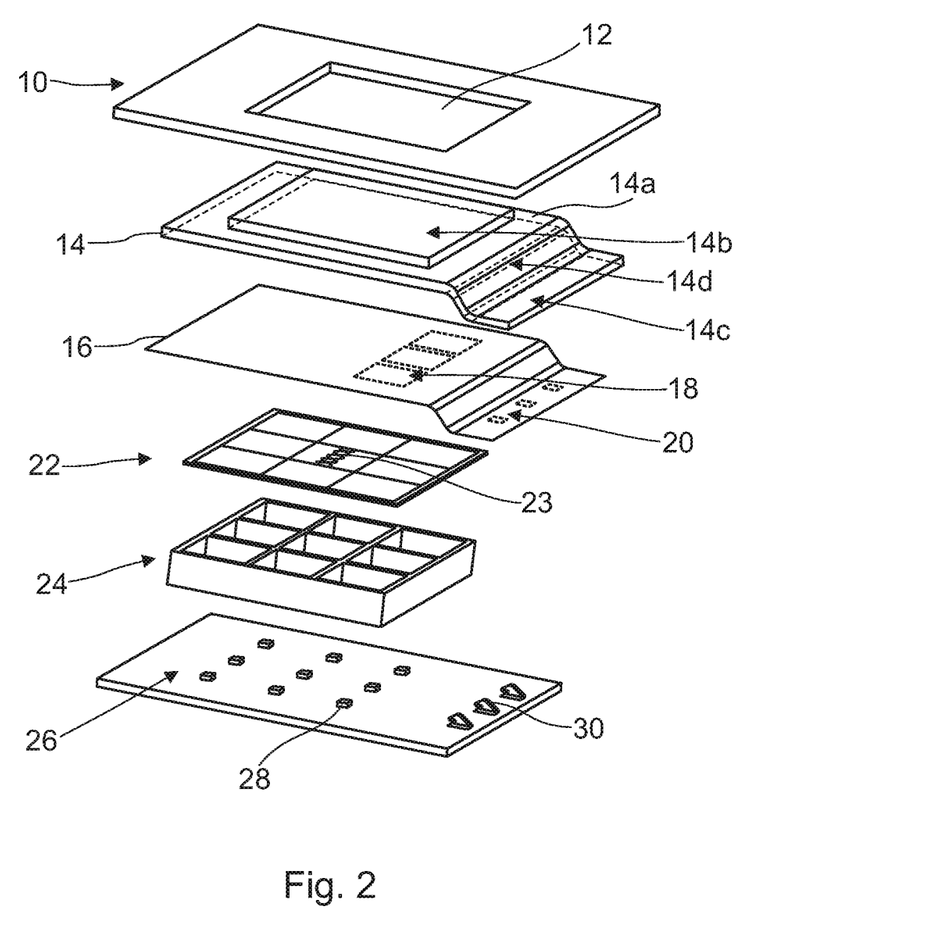
FIG. 2 is an exploded perspective view of the input device of FIG. 1.

As shown in FIGS. 1 and 2, the cover plate 14 furthermore has a contacting section 14c, which is connected to the plate section 14a via a multiply bent connecting section 14d. As can be seen in FIG. 1, the plate section 14a and the contacting section 14c of the cover plate 14 extend in different planes A and B, respectively. The planes A and B are (substantially) parallel to the control panel 10. The cover plate 14 is preferably formed integrally with its various sections 14a-d. Furthermore, the contacting section 14 is preferably connected rigidly to the plate section 14a, so that the contacting plane B is positioned at a predetermined and fixed distance from the sensor plane A.

In this exemplary embodiment, the described cover plate 14 is used as a carrier for a sensor film 16. The sensor film 16 is configured as a nonrigid component and is firmly connected to the side of the cover plate 14 facing away from the user, for example by means of a transparent adhesive.

The sensor film 16 consists essentially of a transparent plastic film (for example PET or PC). It is furthermore printed with electrically conductive structures, which form in particular capacitive sensor fields 18, electrical contact fields 20 and electrical connections between them. While the capacitive sensor fields 18 are positioned in the region of the control section 14b of the cover plate 14 in the sensor plane A, the electrical contact fields 20 are provided in the region of the contacting section 14c of the cover plate 14 in the contact plane B. In general, one sensor field 18 is respectively connected electrically conductively to one contact field 20. Depending on the application, one or more sensor fields 18 may be provided in order to provide the user with one or more control elements.

Each capacitive sensor field 18 forms, together with for example a finger of the user, by means of the cover plate 14 as a dielectric, a capacitor which is variable according to the actuation of the input device, i.e. the contact or noncontact, or proximity or nonproximity, of the control section 14*b* of the cover plate 14. The variation in the capacitance of the capacitive sensor field 18 may be acquired at the contact field 20, connected to the sensor field 18, of the sensor film 16 and processed and evaluated by suitable evaluation electronics.

Figure 3:
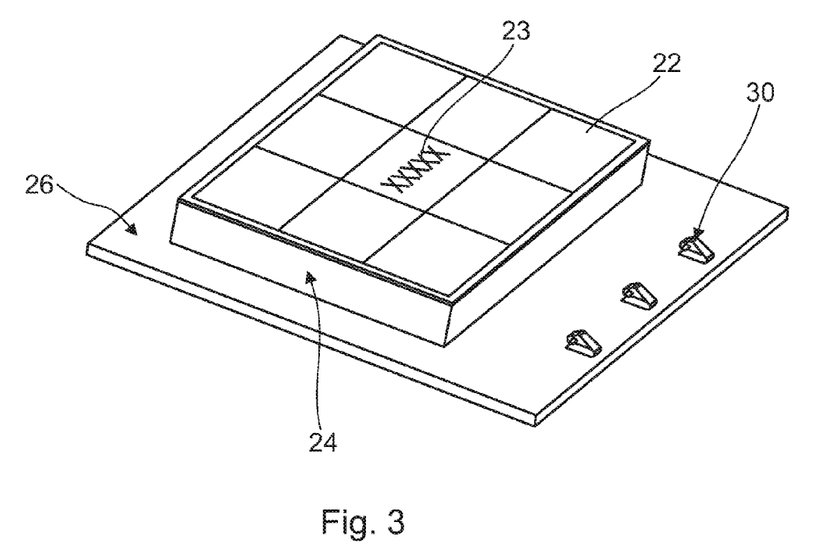
FIG. 3 shows a perspective view of a premounted component for the input device of FIG. 1.
Figure 4:
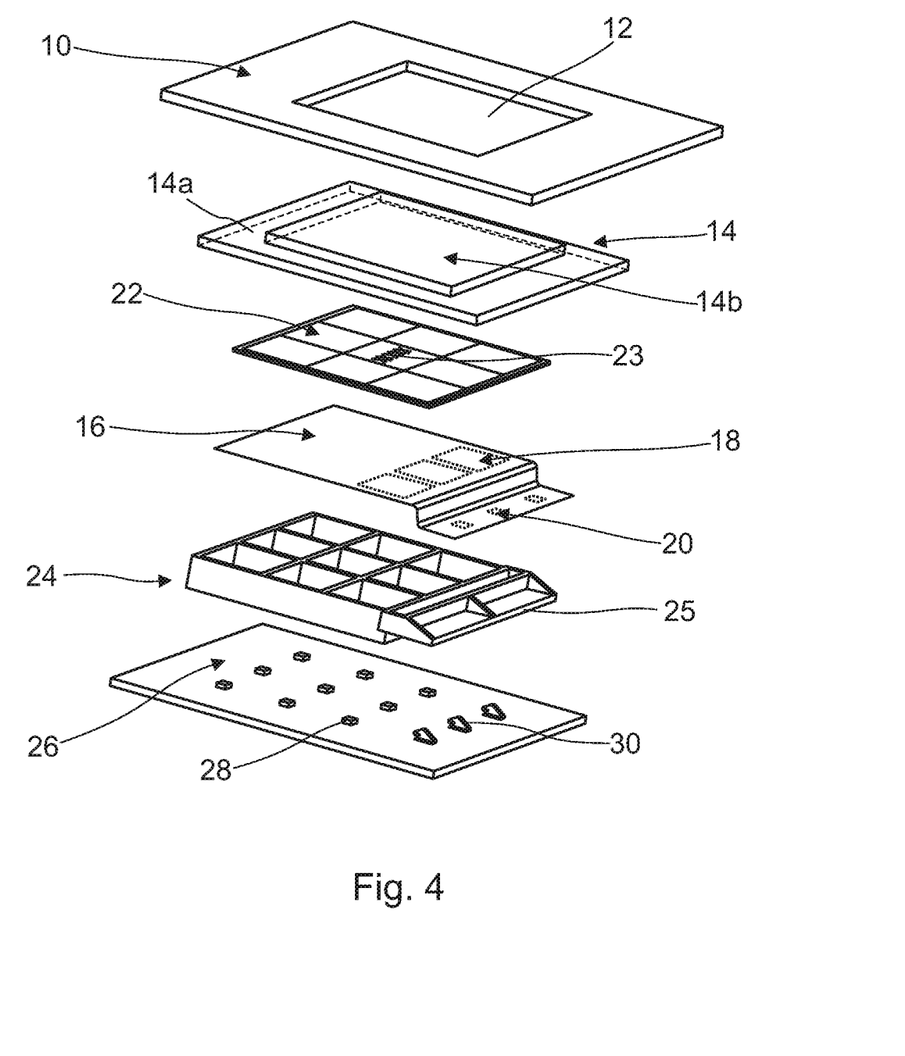
FIG. 4 shows an exploded perspective representation of an input device according to a second exemplary embodiment of the invention.

The input device furthermore contains a decorative film 22, a spacer element 24 and a carrier plate 26, which may be present as premounted components, as illustrated in FIG. 3.

Similarly to the sensor film 16, the decorative film 22 consists essentially of a transparent plastic film (for example PET or PC). It is furthermore provided with one or more decorative elements 23 in the form of symbols, numbers, letters, segments, a pictogram, bars, etc. and single or multiple combinations of these elements, which may be configured as positive or negative elements and/or optionally colored, provided. The decorative elements 23 are, for example, printed onto the decorative film 22.

A plurality of lighting devices 28 or light sources 28 in the form of light-emitting diodes or light-emitting diode groups, as well as a plurality of electrical contact elements 30 in the form of contact spring, are arranged on the carrier plate 26. On the side of the carrier plate (printed circuit board or simple plastic plate) 26 facing toward the user, the spacer element 24 is positioned in the form of a so-called lightbox. This lightbox 24 ensures on the one hand the separation of the decorative film 22, the sensor film 16 and the cover plate 14 from the lighting device 28 on the carrier plate 26, and on the other hand separate backlighting or transmitted illumination of individual regions of the decorative film 22, the sensor film 16 and the control section 14*b* of the cover plate 14. To this end, the walls of the lightbox 24 are preferably configured to be reflective.

As represented in FIG. 3, the decorative film 22 is adhesively bonded onto the spacer element 24, which may in turn be connected firmly to the carrier plate 26 (for example by adhesive bonding, snap-fastening or the like).

As can be seen in FIG. 2, the decorative elements 23 of the decorative film 22 are not necessarily positioned directly behind the sensor fields 18 of the sensor film 22, but may optionally also be offset therefrom. Owing to the production of the decorative film 22 separately from the production of the sensor film 16, the decorative film 22 can be adapted simply and flexibly to different variants of the input device, without also having to modify the sensor film 16.

In the assembled state of the input device (cf. FIG. 1), the electrical contact fields 20 of the sensor film 16 are electrically conductively in contact with the electrical contact elements 30 on the carrier plate 26. To this end, the contact fields 20 of the sensor film 16 are pressed with the aid of the contacting section 14*c* of the cover plate 14 in the direction of the carrier plate 26, and the contact elements 30 on the carrier plate 26 are configured as resilient contact springs which are prestressed in the direction of the cover plate 14.

The contact elements 30 on the carrier plate 26 are electrically conductively connected to evaluation electronics (not illustrated), which are preferably likewise arranged on the carrier plate 26 (for example on its lower side facing away from the user). The evaluation electronics are in turn connected to an appliance controller or integrated into such a controller.

The mutual positioning of the carrier plate 26 (with the lightbox 24 and decorative film 22) on the one hand and the cover plate 14 (with the sensor film 16) on the other hand may, for example, be achieved by direct connection of these components to one another or by connection of these components respectively to the control panel 10 or to another component of the household appliance.

Referring to FIGS. 4 to 7, a second exemplary embodiment of a contact and/or proximity-sensitive input device, such as may for example be used in a (large) household appliance, for example a washing machine or a dishwasher, will now be described in more detail. In this case, identical or corresponding components are denoted by the same reference numbers as in the first, abovedescribed exemplary embodiment.

Figure 5:
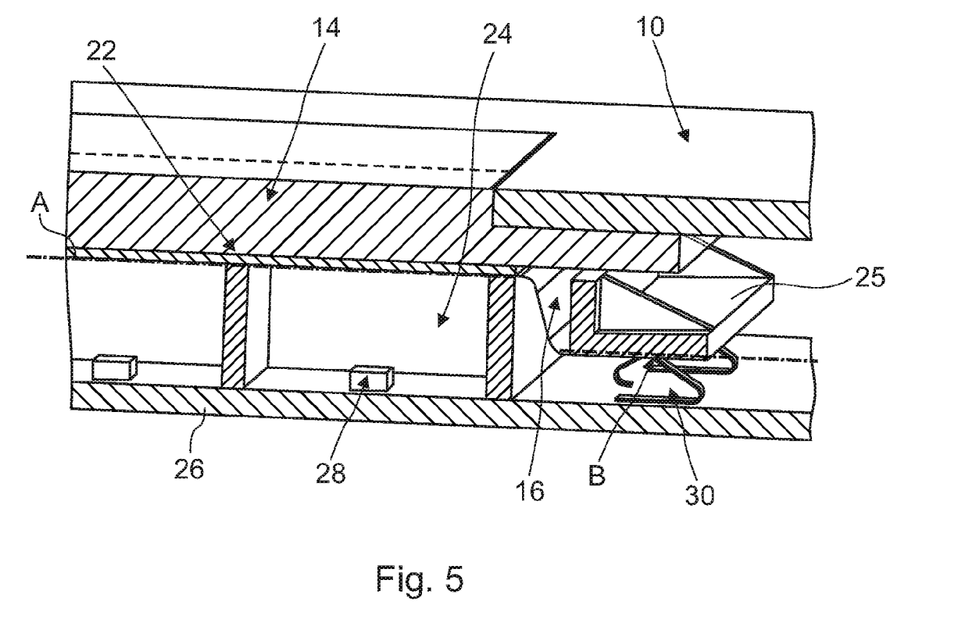
FIG. 5 is a perspective partial sectional view of the input device of FIG. 4.
Figure 7:
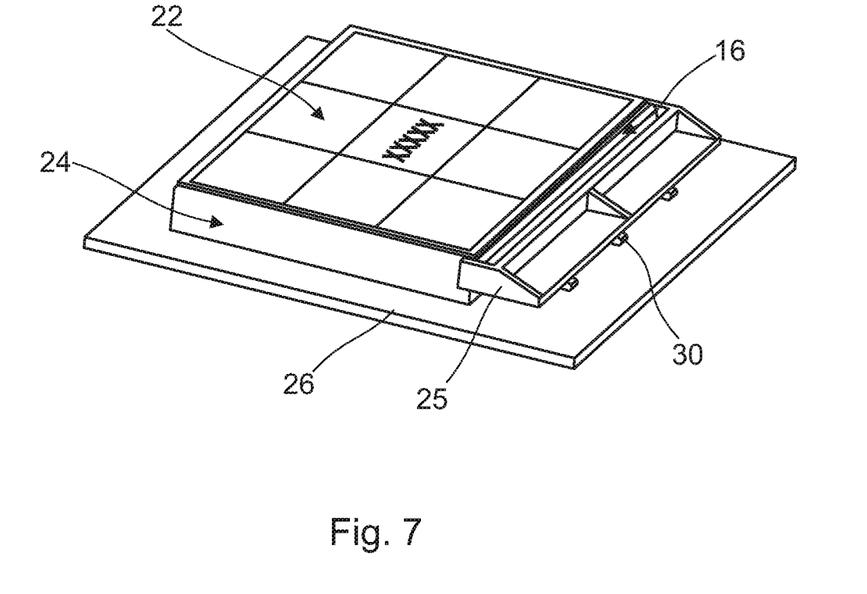
FIG. 7 shows a perspective view of a further intermediate step during the assembly of the input device of FIG. 4.

In the second exemplary embodiment, the spacer element 24 designed as a lightbox is used as a carrier for the sensor film 16. That is to say, the sensor film 16 is adhesively bonded onto the upper side of the lightbox 24 facing toward the user. In order to keep the electrical contact fields 20 in electrically conductive contact with the contact springs 30 on the carrier plate 26, in this exemplary embodiment the lightbox 24 is provided with a contacting section 25, or is rigidly connected to such a section. As represented in FIGS. 5 and 7, the sensor film 16 is for example "threaded" through an opening in the contacting section 25 of the lightbox 24 to its lower side facing toward the carrier plate 26. In this configuration of the input device, the contacting section 14*c* on the cover plate 14 may correspondingly be omitted.

Figure 6:
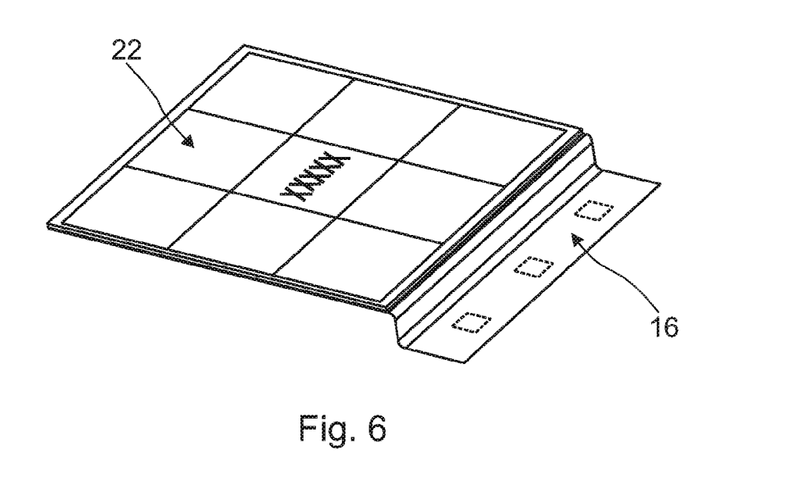
FIG. 6 shows a perspective view of a premounted component for the input device of FIG. 4.

The decorative film 22 with the decorative elements 23 may, for example, be laminated onto the sensor film 16 as represented in FIG. 6, and then adhesively bonded together therewith onto the lightbox 24. As an alternative, the decorative film 22 may also be adhesively bonded to the lower side of the cover plate 14 facing away from the user.

In other regards, the components of the input device of FIGS. 4 to 7 correspond to those of the first exemplary embodiment.

Although not represented, in both exemplary embodiments it is also possible to adhesively bond the decorative film 22 onto the outer side, facing toward the user, of the control section 14*b* of the cover plate 14.

The following is a summary list of reference numerals and the corresponding structure used in the above description of the invention:

10 control panel
12 recess
14 cover plate
14*a* plate section
14*b* control section
14*c* contacting section
14*d* connecting section
16 sensor film
18 capacitive sensor field
20 electrical contact field
22 decorative film
23 decorative element
24 spacer element
25 contacting section
26 carrier plate
28 lighting device
30 electrical contact element
A sensor plane
B contacting plane

The invention claimed is:

1. A contact and/or proximity-sensitive input device, comprising:
  a cover plate having at least one at least partially light-transmissive control section, the control section facing toward a user of the input device and forming a control field for the user;

an at least partially light-transmissive sensor film having at least one capacitive sensor field, said sensor film having at least one electrical contact field;

an at least partially light-transmissive decorative film having at least one decorative element, said decorative film being configured as a separate component from said sensor film;

a carrier plate and at least one lighting device disposed on said carrier plate;

at least one electrical contact element disposed on said carrier plate; and at least one spacer element having a contacting section configured to keep said at least one electrical contact field of said sensor film in electrically conductive contact with said at least one electrical contact element disposed on said carrier plate;

said carrier plate, said decorative film, said sensor film and said cover plate being successively disposed relative to one another so that light emitted by said lighting device passes through said decorative film, said sensor film and said control section of said cover plate.

2. The input device according to claim 1, configured for integration in a household electronic appliance.

3. The input device according to claim 1, wherein:
said at least one electrical contact field of said sensor film being electrically conductively connected to said capacitive sensor field; and
said at least one electrical contact element is in electrically conductive contact with said electrical contact field of said sensor film.

4. The input device according to claim 1, wherein said decorative film is fixedly connected to said sensor film.

5. The input device according to claim 1, wherein said decorative film is fixedly connected to said cover plate or to said spacer element.

6. The input device according to claim 1, which comprises at least one spacer element on a side of said carrier plate facing toward said cover plate, said at least one spacer element separating said decorative film, said sensor film and/or said cover plate from said at least one lighting device on said carrier plate.

7. The input device according to claim 6, wherein said sensor film is fixedly connected to said spacer element.

8. The input device according to claim 6, wherein said at least one spacer element is a light guide element configured for guiding light emitted by said at least one lighting device in a direction of said cover plate.

9. The input device according to claim 6, wherein said sensor film has said capacitive sensor field and at least one electrical contact field that is electrically conductively connected to said capacitive sensor field, and wherein said sensor film is bent so that said at least one capacitive sensor field and said at least one electrical contact field are positioned in two different planes extending approximately parallel to said carrier plate.

10. The input device according to claim 6, wherein said sensor film is fixedly connected to a side of said cover plate averted from the user.

11. The input device according to claim 10, wherein said cover plate has a contacting section configured to keep said at least one electrical contact field of said sensor film in electrically conductive contact with said at least one electrical contact element on said carrier plate.

12. A household electronic appliance, comprising at least one contact and/or proximity-sensitive input device according to claim 1.

13. The household electronic appliance according to claim 12, wherein the control section of the cover plate of the input device is arranged behind an at least partially light-transmissive control panel or in a recess of a control panel of the electronic appliance.

* * * * *